United States Patent
Baumeister et al.

(10) Patent No.: US 6,794,209 B2
(45) Date of Patent: Sep. 21, 2004

(54) METHOD FOR THE IN-SITU FABRICATION OF DFB LASERS

(75) Inventors: Horst Baumeister, München (DE); Roland Gessner, Geretsried (DE); Eberhard Veuhoff, Ottobrunn (DE); Gundolf Wenger, Neubiberg (DE)

(73) Assignee: Infineon Technologies AG, Munich (DE)

( * ) Notice: Subject to any disclaimer, the term of this patent is extended or adjusted under 35 U.S.C. 154(b) by 13 days.

(21) Appl. No.: 10/186,647

(22) Filed: Jul. 1, 2002

(65) Prior Publication Data

US 2003/0003615 A1 Jan. 2, 2003

(30) Foreign Application Priority Data

Jun. 29, 2001 (DE) .......................................... 101 32 231

(51) Int. Cl.⁷ ................................................ H01L 21/00
(52) U.S. Cl. .......................................... 438/22; 438/32
(58) Field of Search ...................... 438/22, 32; 372/45, 372/96

(56) References Cited

U.S. PATENT DOCUMENTS 6,292,503 B1 * 9/2001 Watanabe et al. ............. 372/45

FOREIGN PATENT DOCUMENTS

| DE | 34 45 725 C2 | 7/1985 |
| DE | 38 37 874 A1 | 5/1990 |
| DE | 0390614 B1 | 10/1990 |
| DE | 39 36 694 C2 | 11/1990 |
| EP | 0 390 614 B1 | 10/1990 |

OTHER PUBLICATIONS

Gessner et al., In–situ etching in InP based BH laser struuctres in MOVPE, May 14–18, 2001, 2001 internation conference on Indium Phosphide and related materials, pp. 398–400.*
Reinhold Paul: "Optoelektronische Halbleiterbauelemente" [optoelectronic semiconductor components], *B. G. Teubner Verlag, Stuttgart*, 1992, pp. 195–206.
Masahiko Kondow et al.: "Chemical beam Etching of GaAS Using a Novel Precursor of Tertiarybutylchloride (TBCI)", *Jpn. J. Appl. Phys.*, vol. 38, 1999, pp. L617–L619.

* cited by examiner

*Primary Examiner*—Thanh Nguyen
(74) *Attorney, Agent, or Firm*—Laurence A. Greenberg; Werner H. Stemer; Ralph E. Locher

(57) ABSTRACT

The invention relates to a method for fabricating a structure in a semiconductor material. At least one etching step is carried out in-situ in an epitaxy installation and tertiary butyl chloride is used as the etchant. The at least one etching step produces at least one grating structure of a DFB laser. This provides an efficient method for fabricating DFB lasers.

13 Claims, 1 Drawing Sheet

METHOD FOR THE IN-SITU FABRICATION OF DFB LASERS

BACKGROUND OF THE INVENTION

Field of the Invention

The invention relates to a method for the in-situ fabrication of DFB (Distributed Feedback) lasers in an epitaxy installation in which tertiary butyl chloride is used as the etchant.

DFB lasers have very fine grating structures that reflect the laser radiation in the layer stack of the DFB laser. In this case, in particular, the uniformity (period structure: approximately 100 nm) of the grating structure is important in order to obtain a good reflection behavior. Since DFB lasers are adequately described in the literature (e.g. Paul, Optoelektronische Halbleiterbauelemente [Optoelectronic semiconductor components], 1992), a description of the fundamental construction of the DFB laser is dispensed with below.

It is known to fabricate this fine grating structure of the DFB laser by using a photolithography step and a subsequent wet-chemical etching step. To that end, an interference structure is produced holographically in a photoresist layer. After development and fixing, the photoresist layer serves as an etching mask for the subsequent wet-chemical etching.

In this case, there is the problem that the etching solution is generally stable only for a few minutes since reactions with the ambient air take place. Resist residues on the surface of the sample and contaminants in the laboratory air also contribute to impairing the quality of the layer fabrication.

The publication by Kondow, Shi, Tu "Chemical Beam Etching of GaAs using a novel precursor of Tertiary butyl chloride (TBCl)" in Jpn. J. Appl. Phys., Vol 38, (1999) pp L617–619 discloses etching a GaAs substrate using gaseous tertiary butyl chloride (TBCl). As specified by the authors, however, this method is not suitable for etching deep layers in GaAs substrates.

SUMMARY OF THE INVENTION

It is accordingly an object of the invention to provide an efficient method for fabricating DFB lasers.

With the foregoing and other objects in view there is provided, in accordance with the invention, a method for fabricating a structure in a semiconductor material. The method includes producing at least one grating structure of a DFB laser by using tertiary butyl chloride as an etchant while performing at least one etching step in-situ in an epitaxy installation.

In accordance with an added feature of the invention, the grating structure has an etched layer thickness that is thicker than 10 nm.

In accordance with an additional feature of the invention, the grating structure has an etched layer thickness that is thicker than 80 nm.

In accordance with another feature of the invention, after performing the at least one etching step, at least one layer is grown in-situ in the epitaxy installation.

In accordance with a further feature of the invention, before performing the at least one etching step, at least one mask layer made of $SiO_2$ is grown.

In accordance with a further added feature of the invention, the at least one mask layer is removed ex-situ.

In accordance with a further additional feature of the invention, before performing the at least one etching step, at least one mask layer is applied by performing a lithography step or a sputtering step.

In accordance with yet an added feature of the invention, before performing the at least one etching step, at least one mask layer made of a III-V semiconductor material is grown.

In accordance with yet an additional feature of the invention, the semiconductor material is $Ga_xIn_{1-y}As_yP_{1-y}$ or AlGaInAs.

In accordance with yet another feature of the invention, an etching rate is chosen dependent on a gallium proportion so that the mask layer is dissolved during the at least one etching step.

In accordance with another added feature of the invention, an etching rate is chosen dependent on the semiconductor material of the mask layer so that the mask layer is dissolved during the at least one etching step.

In accordance with another additional feature of the invention, an etching rate is chosen such that the mask layer is removed at a completion of the at least one etching step.

In accordance with an added feature of the invention, the at least one mask layer made of the III-V semiconductor material is removed during the at least one etching step.

It has been shown that at least one etching step using TBCl (Tertiary butyl chloride) is highly suited to producing at least one grating structure of a DFB laser. Despite the relatively large thickness of the grating structure layer, the fine structures can readily be etched in-situ using TBCl in the epitaxy installation. In this case, it is advantageous if, as a result of the at least one etching step, the etched layer thickness of the grating structure is thicker than 10 nm, and preferably thicker than 80 nm.

A further advantageous embodiment of the method consists in the fact that, after at least one etching step, at least one in-situ growth of a layer is effected in the epitaxy installation. By virtue of the in-situ etching, the sample need not be moved from the epitaxy installation, which prevents contamination and saves time.

It is advantageous if, before at least one etching step, at least one mask layer made of $SiO_2$ is grown. It is also advantageous if, before at least one etching step, at least one mask layer is applied lithographically or by sputtering. For masks applied in this way, it is advantageous that, in a further method step, at least one mask layer is removed ex-situ.

It is particularly advantageous if, before at least one etching step, at least one mask layer made of a III-V semiconductor material is grown. Such a semiconductor material may be removed in-situ using TBCl. In this case, it is advantageous if $Ga_xIn_{1-y}As_yP_{1-y}$ or AlGaInAs is used as the mask material. The etching rate of the mask material can advantageously be defined by setting the composition (e.g. the gallium proportion x), which enables the mask material to be etched away in a controlled manner.

Furthermore, it is advantageous if the etching rate is chosen precisely such that the mask is removed from the sample at the end of the etching step.

If at least one mask layer made of III-V semiconductor material is removed during the in-situ etching step, a considerable amount of time is saved. The mask will be dissolved in a defined manner during etching.

Other features which are considered as characteristic for the invention are set forth in the appended claims.

Although the invention is illustrated and described herein as embodied in a method for the in-situ fabrication of DFB lasers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
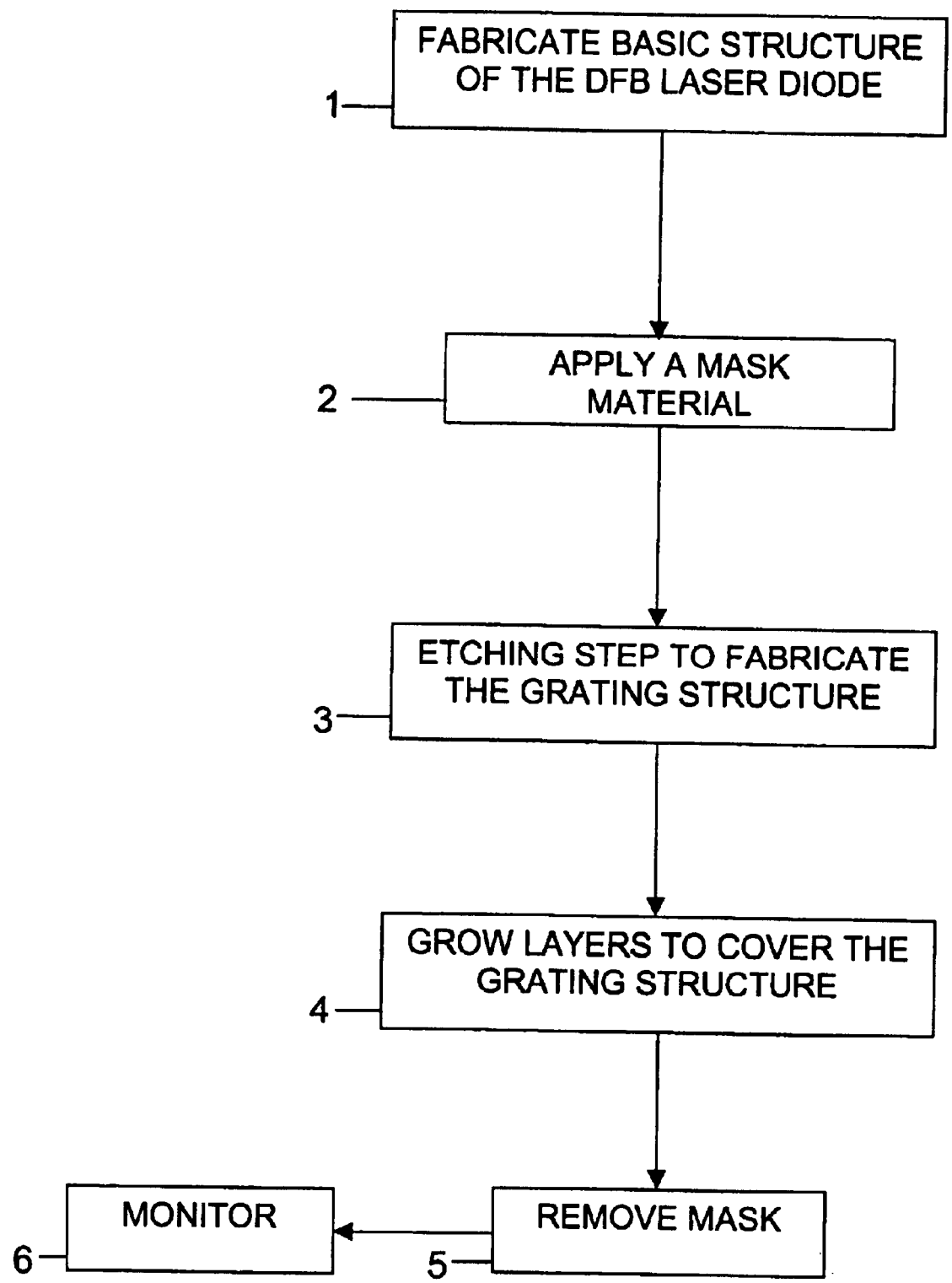
FIG. 1 is a flow diagram for illustrating the steps of an embodiment of the inventive method.

Referring now to the figures of the drawing in detail and first, particularly, to FIG. 1 thereof, there is shown a flow diagram for illustrating the steps of an embodiment of the inventive method. Fabricating semiconductor components using epitaxy and masking are known, in principle, so that only the essential steps for explaining the invention are illustrated in FIG. 1. In this case, a wafer serves as a substrate. The substrate with the layer construction of the semiconductor component is referred to as the sample. In this case, the mask is arranged above the layer system of the DFB laser.

In a first method step 1, the basic structure of the DFB laser diode is fabricated epitaxially in a manner known per se.

In a subsequent second method step 2, a mask material is applied. This is done by a lithographic step in the present case. However, as an alternative, $SiO_2$ can be sputtered. A further alternative is to use monocrystalline III-V semiconductor material as the mask material (e.g. $Ga_xIn_{1-y}As_yP_{1-y}$ or AlGaInAs).

The third method step is subsequently performed, which consists of an etching step 3 for fabricating the grating structure of the DFB laser. To that end, tertiary butyl chloride (TBCl) is used. Under standard conditions, TBCl $((CH_3)_3CCL)$ has a melting point of $-29°$ C. and a boiling point of $51°$ C. and is gaseous under the conditions in the epitaxy installation. Importantly, the etching step 3 is performed in-situ in the epitaxy installation, so that the sample does not need to be moved from the installation during the etching step 3. Consequently, contact with air does not take place and process time is saved. The in-situ etching is made possible by virtue of the fact that TBCl is less aggressive than other etching media.

The etching step 3 produces the very fine grating structure that serves for reflecting the light generated in the active zone of the DFB laser diode. The layer thickness of the grating structure is approximately 80 nm. In particular, the planar grating structure of the DFB laser can also be fabricated by the etching step 3 using TBCl.

Afterward, in a fourth method step 4, further layers are grown above the grating structure of the DFB laser in the epitaxy installation. Consequently, the grating structure of the DFB laser is covered with further layers and is protected against external influences.

In a fifth method step 5, the applied mask is then removed. This can be done ex-situ by means of an etching operation. The mask removal is particularly advantageously effected in-situ if the mask material is composed of a III-V semiconductor material. This mask material is etched away during etching using TBCl whilst still in the epitaxy installation. This avoids contamination during the mask removal.

In a sixth method step 6, the final monitoring then takes place in the epitaxy installation.

The embodiment of the invention is not restricted to the preferred exemplary embodiments specified above. Rather, there are a number of conceivable variants that also use the inventive method.

We claim:

1. A method for fabricating a structure in a semiconductor material, which comprises:
   growing at least one mask layer made of a III-V semiconductor material;
   producing at least one grating structure of a DFB laser by using tertiary butyl chloride as an etchant while performing at least one etching step in-situ in an epitaxy installation; and
   choosing an etching rate being dependent on the III-V semiconductor material resulting in the mask layer being dissolved during the etching step.

2. The method according to claim 1, wherein: the grating structure has an etched layer thickness that is thicker than 10 nm.

3. The method according to claim 1, wherein: the grating structure has an etched layer thickness that is thicker than 80 nm.

4. The method according to claim 1, which comprises:
   after performing the at least one etching step, growing at least one layer in-situ, in the epitaxy installation.

5. The method according to claim 1, which comprises: before performing the at least one etching step, growing the at least one mask layer to be made of $SiO_2$.

6. The method according to claim 5, which comprises: removing the at least one mask layer ex-situ.

7. The method according to claim 1, which comprises:
   before performing the at least one etching step, applying the at least one mask layer by performing a step selected from the group consisting of a lithography step and a sputtering step.

8. The method according to claim 7, which comprises: removing the at least one mask layer ex-situ.

9. The method according to claim 1, wherein the III-V semiconductor material is selected from the group consisting of $Ga_xIn_{1-y}As_yP_{1-y}$ and AlGaInAs, where $0 \leq x \leq 1$ and $0 \leq y \leq 1$.

10. The method according to claim 9, which comprises:
    choosing the etching rate to be dependent on a gallium proportion so that the mask layer is dissolved during the at least one etching step.

11. The method according to claim 1, which comprises:
    choosing the etching rate such that the mask layer is removed at a completion of the at least one etching step.

12. The method according to claim 1, wherein: the at least one mask layer made of the III-V semiconductor material is removed during the at least one etching step.

13. A method for fabricating a structure in a semiconductor material, which comprises:
    applying at least one mask layer formed from a III-V semiconductor material by using a step selected from the group consisting of a lithography step and a sputtering step;
    producing at least one grating structure of a DFB laser by using tertiary butyl chloride as an etchant while performing at least one etching step in-situ in an epitaxy installation; and
    choosing an etching rate being dependent on the III-V semiconductor material resulting in the mask layer being dissolved during the etching step.

* * * * *